United States Patent [19]

Rheinfelder

[11] 4,198,598
[45] Apr. 15, 1980

[54] SWEPT FREQUENCY CIRCUIT FOR PRECISION GAIN OR LOSS MEASUREMENTS

[76] Inventor: William A. Rheinfelder, 3542 W. Northview, Phoenix, Ariz. 85021

[21] Appl. No.: 914,379

[22] Filed: Jun. 12, 1978

[51] Int. Cl.$^2$ .................. G01R 27/00; G01R 13/20
[52] U.S. Cl. ............................ 324/57 SS; 324/121 R
[58] Field of Search ............ 324/121 R, 77 A, 74, 324/130, 102, 57 R, 57 SS

[56] References Cited
U.S. PATENT DOCUMENTS 2,563,395  8/1951  Carpentier ................. 324/121 R Primary Examiner—Rudolph V. Rolinec
Assistant Examiner—Ernest F. Karlsen Attorney, Agent, or Firm—Cahill, Sutton & Thomas

[57] ABSTRACT

A swept frequency circuit for use with several detectors and an oscilloscope is described, the output of which is controlled remotely by an electronic attenuator. A closed feedback loop is formed by a detector rectifying the swept output frequency as it is swept from low to high frequency during one half of the sweep cycle (determined by the sweep rate). This rectified signal is processed through switchable attenuators or resistors and applied to the electronic attenuator so as to decrease the output of the swept frequency signals. In particular, the switchable attenuators or resistors can be arranged to produce an upper and lower calibration trace, forming a "window" of, for example, ±1 dB, as well as several test traces so that several events may be measured simultaneously in the "window".

4 Claims, 5 Drawing Figures

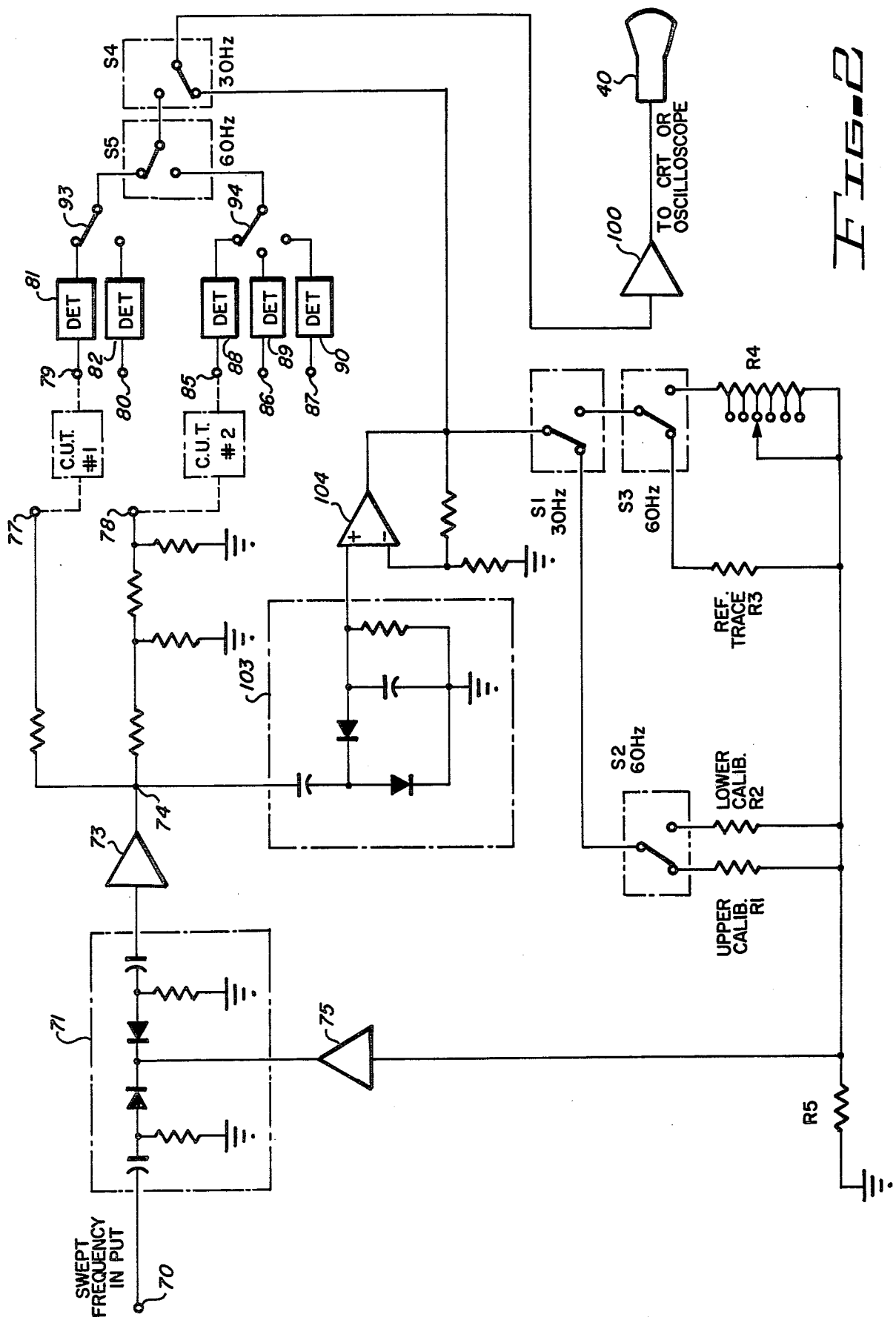

SWEPT FREQUENCY CIRCUIT FOR PRECISION GAIN OR LOSS MEASUREMENTS

The present invention pertains to swept frequency test circuits and more particularly, to circuits for use with detectors and an oscilloscope for investigating parameters of circuits through the use of oscilloscopic traces.

Oscilloscopes are commonly used as a means for investigating parameters of circuits being tested. Typically, a swept-frequency test signal is applied to the input of a circuit under test. The output signal of the circuit under test is detected and applied to the vertical deflection circuit of the oscilloscope. The horizontal output of the sweep generator is applied to the horizontal deflection circuit of the oscilloscope. The result of the above procedure is a visual trace upon the screen of the oscilloscope showing the relative amplitude of the signal as modified by the circuit under test. The face of the oscilloscope is typically provided with a grid which may be calibrated to enable the operator to ascertain the level of the test trace.

When several circuits are to be tested and their respective test traces observed to determine whether or not the parameters under investigation fall within specified limits, it is common practice to calibrate the oscilloscope by marking the face of the scope with grease pencil. Thus, upper and lower limits of acceptable signal levels are indicated by the horizontal lines thus drawn on the face of the oscilloscope. The circuits to be tested are then successively connected into the system and their respective test traces observed.

Such techniques are subject to several errors such as the parallax inherent in the use of marking techniques on the face of the scope; further, in critical test environments, the width of the line drawn on the face of the scope may represent an unacceptable variation in the limits of the investigating parameter. Additional difficulties adversely affect the accuracy of the above-described technique, including errors caused by oscilloscope drift in the vertical or horizontal axis, drift in the oscilloscope gain and similar drifts in the swept frequency generator. These errors give rise to the need for frequent recalibration of the test system, although these errors can seldom be completely overcome. In many applications, it is desirable to simultaneously display several traces on the screen of an oscilloscope wherein each trace represents a different parameter of the same circuit. Heretofore, it was necessary to consider only a single parameter and then reconnect the circuit under test in an appropriate manner to obtain a trace representing the second parameter, etc.

It is therefore an object of the present invention to provide a swept frequency circuit for use with a detector and an oscilloscope for producing calibration traces electronically on the oscilloscope.

It is also an object of the present invention to provide a swept frequency circuit that will eliminate errors in the traces on an oscilloscope caused by inherent drift of detector, oscilloscope or swept frequency generator.

It is still a further object of the present invention to provide a swept frequency circuit for use with detectors and an oscilloscope to permit the simultaneous display of several measurements or parameters of a circuit under test.

The present invention may more readily be described by reference to the drawings in which:

FIG. 2 is a block diagram of a preferred embodiment of the present invention.

Figure 1:
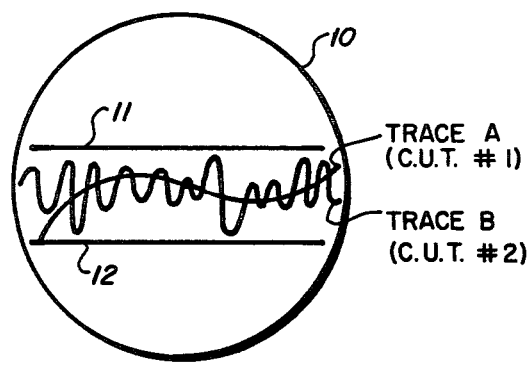
FIG. 1 is an illustration of a typical display on an oscilloscopic screen showing typical traces produced by the use of the circuit of the present invention.

Referring now to FIG. 1, the oscilloscope screen 10 is shown having a trace A and a trace B, each of which represents a typical trace of a circuit parameter for a circuit under test (C.U.T. #1 and C.U.T. #2, respectively).

As discussed above in connection with the prior art, an upper calibration line 11 and a lower calibration line 12 would be drawn by grease pencil on the face of the oscilloscope; however, in accordance with the teachings of the present invention, upper and lower calibration lines are electronically generated internal calibration traces 11 and 12 on the face of the oscilloscope.

To provide the display shown in FIG. 1, the circuit of FIG. 2 may be used. A swept-frequency input signal generated by a swept frequency signal source such as a sweep generator, not forming part of the present invention, is applied to input 70 of an electronically variable p-i-n diode attenuator 71. This diode attenuator 71 serves to control the signal level applied to amplifier 73, the output of which drives branch point 74 where the signal is split into several paths: one path leading to high-level signal source output 77; a second path leading to low-level signal source output 78; and a third path leading to detector 103.

This third path is part of a negative feedback loop comprising detector 103, amplifier 104, high-speed switches S1, S2 and S3, potentiometric resistors R1, R2, R3, R4 and R5 and amplifier 75 which drives the diode attenuator 71. As will be seen, the position of the high-speed switches S1, S2 and S3 in the negative feed loop determines the gain of the negative feedback loop and with it the signal output level at 74, 77 and 78. For example, with S1 and S2 in the left position, resistors R1 and R5 will be selected, thereby determining a certain signal level at 74; e.g., the predetermined value used for an upper calibration trace 11 in FIG. 1. With S1 in the same position, but S2 now switched to the right, resistors R2 and R5 are selected thereby setting the signal level at 74 for the display of a lower calibration trace 12 in FIG. 1.

Similarly, with S1 in the right position, S3 now determines the signal level at 74, 77 and 78. For example, with S3 in the left position, resistors R3 and R5 determine a reference signal level at 74, 77 and 78 which is typically centered between the two calibration traces to provide a reference signal source for a first test trace. With S3 in the right-hand position, resistors R4 and R5 are selected. R4 typically might be switchable in steps so as to provide varying attenuation for a signal source 74, 77 and 78 to be used for the display of a second test trace.

It may therefore be seen that a single swept-frequency input signal applied to terminal 70 has been made to assume four different precisely determined signal levels. Moreover, the negative feedback loop has served to keep the signal level versus frequency characteristic at 74, 77 and 78 constant during each switched period, that is during each sweep period where S1, S2 and S3 are in a fixed position. For example, if the amplifier 73 caused the signal 74 to be reduced, the detector 103 output would also be reduced, the amplifier 104 output and the amplifier 75 output thereby decreasing the attenuation of attenuator 71 resulting in a corrected (increased) output of amplifier 73. This leveling action serves to keep the signal levels at 77 and 78 constant within a switching cycle of S1, S2, S3, thereby producing a substantially flat calibration trace 11 and 12 in FIG. 1.

The signal source outputs 77 and 78 provide the test signals applied to the input of the circuits under test.

The input of Circuit Under Test 1 (C.U.T. #1) may be connected to signal source output 77 and the output to terminal 79 which is the input to detector 81 connected through manual switch 93 to high-speed switches S5 and S4, amplifier 100 and vertical deflection input to CRT 40. Similarly, let the input of Circuit Under Test 2 (C.U.T. #2) be connected to signal source output 78 and the output to terminal 85 and detector 88. It may be seen that with switch S5 and S4 in the up position, the characteristics of C.U.T. #1 will be displayed; while with S5 in the down position, S4 in the up position, C.U.T. #2 will be displayed. With S4 in the down position, the signal source detector 103 will be displayed. S1 is synchronized to be in the left position with S4 in the down position.

Figure 4:
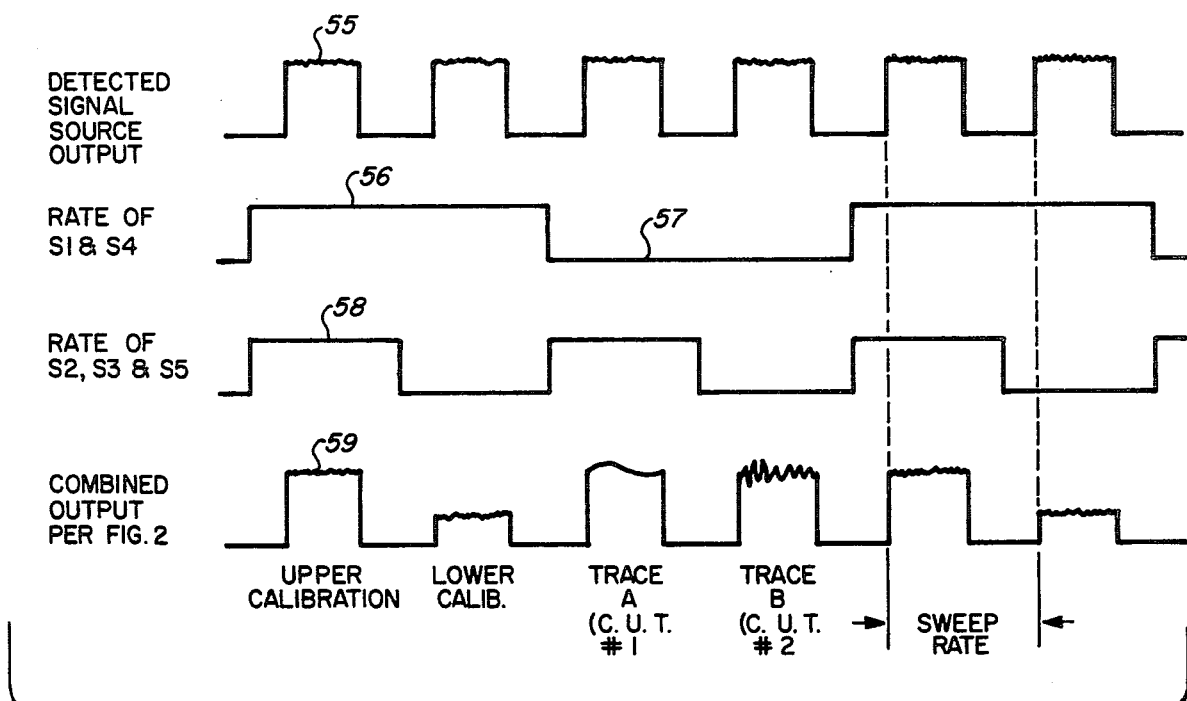
FIG. 4 shows waveforms useful for explaining the operation of the circuit of FIG. 2.

The switching sequence is more clearly seen in FIG. 4. If an oscilloscope were connected directly to the output of detector 81 with the signal source 77 directly connected to the detector input 79, a display such as shown in the top row of FIG. 4 would be seen with the oscilloscope horizontal scan time set to display several cycles. The top of the squarewave-like waveform 55 represents the rectified rf-signal as the frequency is swept from low to high frequency. The bottom of the 37 squarewave" is the interval during which the sweep generator is blanked and the frequency is retraced from high to low for a new cycle. The number of sweep cycles per second is called the sweep rate. Typically, a sweep rate of 120 Hz is chosen. Switches S1 and S4 are now driven at one-fourth the rate or 30 Hz. This is shown in the second row of FIG. 4 where at a high signal level at 56, the switch is closed, while at a low level 57 the switch is open. The rate for S2, S3 and S5 is indicated in the third row of FIG. 4. In the last row of FIG. 4 the final combined result is shown as it is applied to the CRT in FIG. 2. By changing the horizontal scan rate of the CRT, the four displays in the fourth row of FIG. 4 can be made to overlap and the display of FIG. 1 is achieved.

Figure 3:
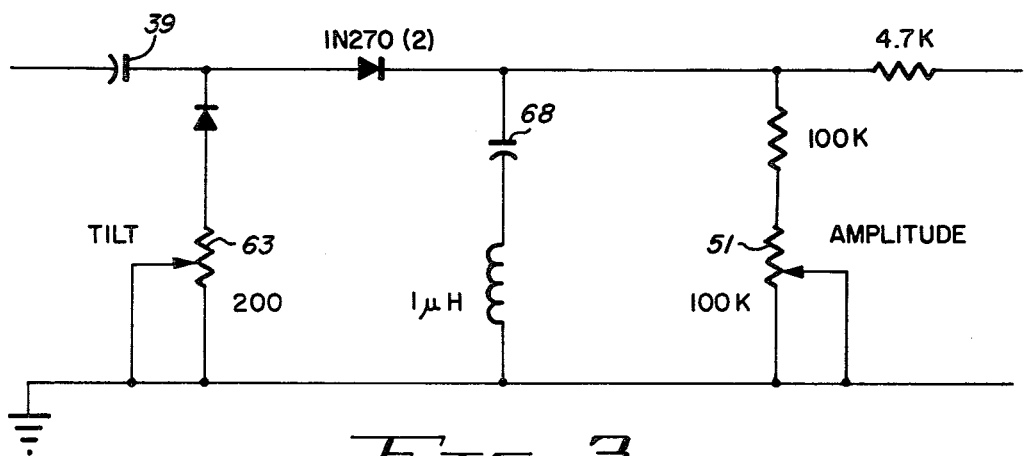
FIG. 3 is a schematic diagram of a typical adjustable detector used in the circuit of FIG. 2.

The switches may be formed from any conveniently available relay system but would obviously be better chosen from available solid state switching devices. Solid state devices, presently commercially availabe, such as RCA CD-4016A CMOS switches, have been found to be well suited for the purpose. A more complete description of typical integrated circuits for use with this invention may be found in RCA CMOS Integrated Circuits publication SSD-203C. The detectors 81, 82, 88, 89, 90 and 103 may take the form shown in FIG. 3 which includes an adjustment for amplitude through the expediencly of potentiometer 51 and an adjustment for tilt 53. By this circuit it is possible to match all detectors so they will initially have the same waveform on the oscilloscope before a circuit under test is applied.

Utilizing the concept described in FIG. 2, it may be seen that oscilloscope drift as well as sweep generator drift will no longer have influence on the accuracy of measurement. Further, since all detectors operate at the same level, diode nonlinearities have been eliminated; further, calibration traces are generated internally and displayed simultaneously with the test traces and the above-described errors associated with external markings on the oscilloscope face are eliminated.

In operation, the circuit of FIG. 2 may be used to display any number of selected traces in addition to the calibration traces. For example, if switch S1 is in the right position and switch S4 is in the up position, one of any number of selectable trace A detectors 81, 82, or trace B detectors 88, 89 and 90 may be connected to the cathode ray tube as determined by the control of switch S5. At the same time, through switch S3, resistors R3 and R4 are selected. It is therefore possible, for example, to raise or lower the sweep level while the test is being performed by switching resistor R4; the raising or lowering of the sweep level being independent of the calibration traces. Furthermore, it is possible to select R3 so that the sweep level is 20 dB higher than during calibration or by adjusting R3 the trace may be centered on the oscilloscope.

Figure 5:
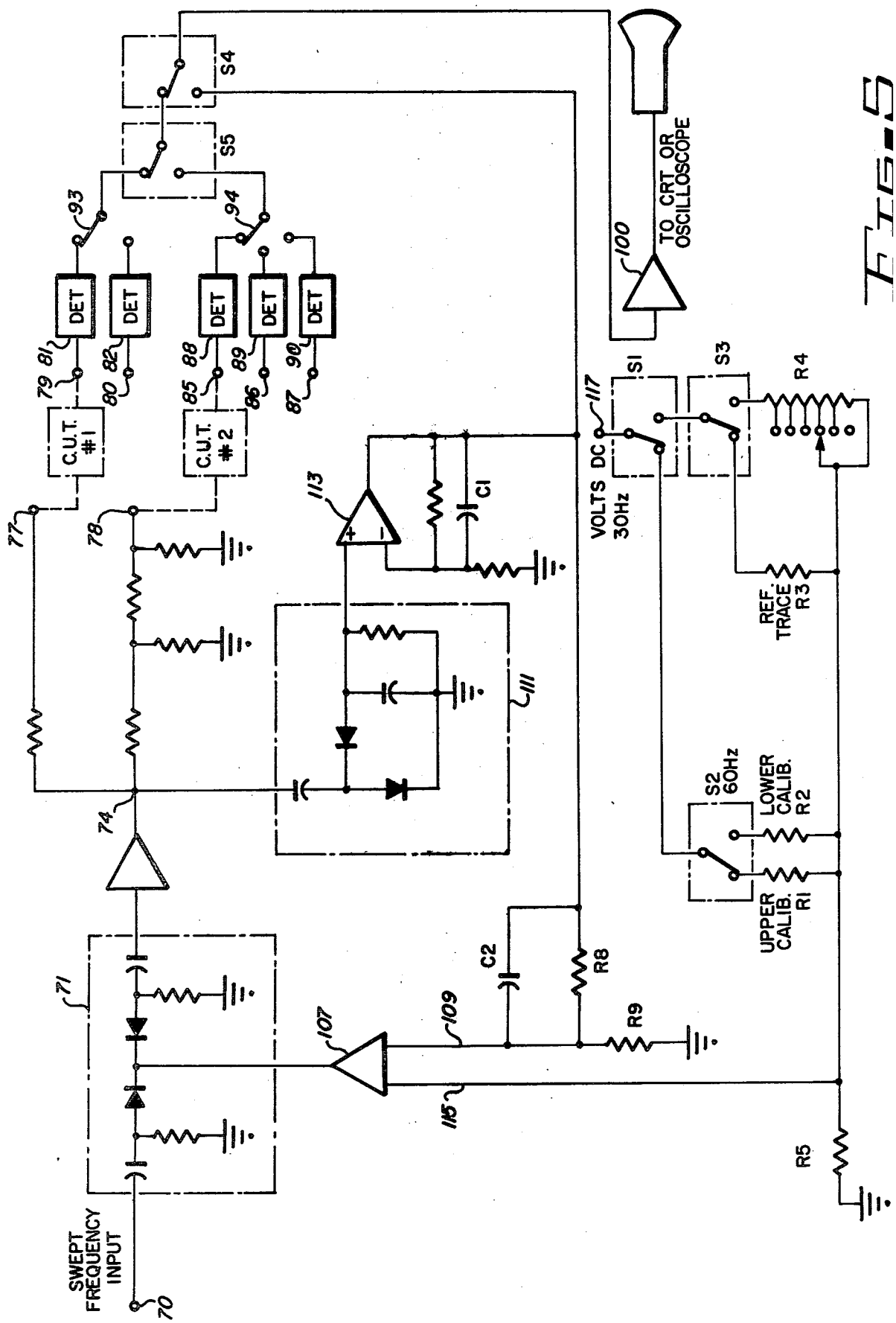
FIG. 5 is a block diagram of another embodiment of the present invention.

Another modification of the system of the present invention is shown in FIG. 5. In FIG. 5, control amplifier 107 is a dual input amplifier such as a typical operational amplifier. Input through conductor 109 is used in a closed negative feedback loop to provide sweep leveling for a flat display by using calibration detector 111, DC-amplifier 113 and voltage divider R8-R9. Capacitors C1 and C2 are used for frequency compensation. The operation of the circuit of FIG. 5 is thus far similar to that of FIG. 2. However, the output level at 74, 77 and 78 is also determined by a superimposed DC-voltage which is applied to conductor 115 at the input of the control amplifier 107. A DC-voltage is applied to terminal 117 and is switched through S1, S2 and S3 and applied to various voltage divider networks in a manner similar to the way described in FIG. 2. By switching DC-voltages separately as shown in FIG. 5, a greater range of rf level may be achieved with freedom from oscillation or other forms of instability.

I claim:

1. In a test system for producing a trace on an oscilloscope, said system receiving a swept frequency signal with a predetermined sweep rate, and having a gain control means for controlling the level of said received swept frequency signals, the improvement comprising:
   (a) a first trace signal producing circuit having a first detector and having means for connecting said first detector in series with a circuit to be tested for producing a first trace signal;
   (b) a second trace signal producing circuit connected to receive said gain controlled swept frequency signal including a second detector and a plurality of resistors and including first switching means for sequentially connecting said second detector in series with each of said resistors and means connecting said resistors to the gain control of said swept frequency signal;
   (c) a second switching means connected to said detectors and to said oscilloscope for sequentially connecting said detectors to said oscilloscope; and
   (d) said first and second switching means being synchronized for sequentially applying said trace signal producing circuits to said oscilloscope.

2. The combination set forth in claim 1, including a third trace signal producing circuit having a detector, and having means for connecting said detector in series with a second circuit to be tested for producing a trace signal; and wherein said second switching means is also connected to said third trace signal producing means to produce a trace on said oscilloscope.

3. In a test system for producing a trace on an oscilloscope and including a swept frequency signal source having a predetermined sweep rate, and having gain control means for controlling the level of output signals from said swept frequency signal source, the improvement comprising:
 (a) a first trace signal producing circuit having a detector and an attenuator and having means for connecting said detector in series with said attenuator and a circuit to be tested for producing a first trace signal;
 (b) a second trace signal producing circuit including a second detector connected to receive said swept frequency signal;
 (c) a first switching means connected to said detectors for sequentially connecting said detectors to said oscilloscope;
 (d) means connecting said second detector of said second trace signal producing circuit to said gain control means;
 (e) a terminal connected to receive a predetermined potential source;
 (f) a pluralitly of resistors, each connected to said gain control means;
 (g) second switching means connected to said terminal and said plurality of resistors for sequentially connecting said each of said resistors to said gain control means; and
 (h) said first and second switching means being synchronized to produce a plurality of traces on said oscilloscope.

4. The combination set forth in claim 3, including a third trace signal producing circuit having a detector, and having means for connecting said detector in series with a second circuit to be tested for producing a trace signal; and wherein said second switching means is also connected to said third trace signal producing means to produce a trace on said oscilloscope.

* * * * *